United States Patent
Ishizuka

(10) Patent No.: US 9,893,421 B2
(45) Date of Patent: Feb. 13, 2018

(54) IMPEDANCE CONVERTER CIRCUIT AND COMMUNICATION TERMINAL DEVICE

(71) Applicant: Murata Manufacturing Co., Ltd., Nagaokakyo-shi, Kyoto-fu (JP)

(72) Inventor: Kenichi Ishizuka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 152 days.

(21) Appl. No.: 15/137,176

(22) Filed: Apr. 25, 2016

(65) Prior Publication Data

US 2016/0240924 A1    Aug. 18, 2016

Related U.S. Application Data

(63) Continuation of application No. PCT/JP2014/064664, filed on Jun. 3, 2014.

(30) Foreign Application Priority Data

Oct. 31, 2013    (JP) .................................. 2013-226115

(51) Int. Cl.
*H01Q 1/50* (2006.01)
*H01Q 5/335* (2015.01)
(Continued)

(52) U.S. Cl.
CPC .......... *H01Q 5/335* (2015.01); *H01Q 21/0006* (2013.01); *H01Q 21/30* (2013.01);
(Continued)

(58) Field of Classification Search
CPC ...... H01Q 5/335; H01Q 1/50; H01Q 21/0006; H01Q 21/30
See application file for complete search history.

(56) References Cited

U.S. PATENT DOCUMENTS 2,633,529 A * 3/1953 Eltgroth ................... H04B 1/16
327/231
2011/0309994 A1    12/2011 Kato et al.
(Continued)

FOREIGN PATENT DOCUMENTS

JP        08-204405 A    8/1996
JP        2001-036328 A    2/2001
(Continued)

OTHER PUBLICATIONS

Official Communication issued in International Patent Application No. PCT/JP2014/064664, dated Sep. 9, 2014.

*Primary Examiner* — Hoang Nguyen
(74) *Attorney, Agent, or Firm* — Keating & Bennett, LLP

(57) ABSTRACT

An impedance converter circuit includes a transformer with a primary coil connected to a power feed port, a phase shifter circuit connected between a secondary coil of the transformer and an antenna port, and a bypass circuit connected between the power feed port and the antenna port. In a high band, an absolute value of impedance of the transformer viewed from the antenna port via the phase shifter circuit is higher than an absolute value of impedance of the bypass circuit. In a low band, the absolute value of the impedance of the transformer viewed from the antenna port via the phase shifter circuit is lower than the absolute value of the impedance of the bypass circuit.

20 Claims, 13 Drawing Sheets

(51) Int. Cl.
*H01Q 21/00* (2006.01)
*H01Q 21/30* (2006.01)
*H03H 7/38* (2006.01)
*H03H 7/09* (2006.01)
*H04B 1/04* (2006.01)

(52) U.S. Cl.
CPC ................ *H03H 7/09* (2013.01); *H03H 7/38* (2013.01); *H04B 1/0458* (2013.01)

(56) References Cited

U.S. PATENT DOCUMENTS

| | | |
|---|---|---|
| 2012/0139814 A1 | 6/2012 | Ishizuka et al. |
| 2013/0187824 A1* | 7/2013 | Kato .................... H04B 1/0458 343/852 |
| 2014/0065980 A1 | 3/2014 | Ueki et al. |

FOREIGN PATENT DOCUMENTS

| | | |
|---|---|---|
| JP | 2007-258863 A | 10/2007 |
| JP | 4761009 B1 | 8/2011 |
| JP | 2012-085306 A | 4/2012 |
| WO | 2012/153691 A1 | 11/2012 |

\* cited by examiner

LOW BAND (800MHz BAND)

HIGH BAND (2GHz BAND)

IMPEDANCE CONVERTER CIRCUIT AND COMMUNICATION TERMINAL DEVICE

BACKGROUND OF THE INVENTION

1. Field of the Invention

The present invention relates to impedance converter circuits to be included in antenna devices and the like, and more particularly to an impedance converter circuit that achieves matching in a wider frequency band range and a communication terminal device including this impedance converter circuit.

2. Description of the Related Art

In order to become compatible with downsized radio communication devices such as cellular phone terminals, a single radiation element is shared with a plurality of communications systems in many cases. In a case that a single radiation element is shared with communication systems of a low band (for example, 800 MHz) and a high band (for example, 2 GHz band), a base resonant mode and a higher-order resonant mode of this single radiation element are used. However, the impedance of the radiation element varies depending on the frequency. Thus, there is an issue in that, when a matching circuit is made to match with one of the frequency bands, the matching circuit may not achieve matching at another frequency.

To resolve the foregoing issue, an impedance converter circuit in which a transformer circuit is used for a matching circuit is proposed as described in Japanese Patent No. 4761009.

Furthermore, as described in International Publication No. WO 2012/153691, another impedance converter circuit is also proposed. Here, the impedance converter circuit is provided with a bypass capacitor so that a low band (800 MHz band) signal mainly passes through a matching circuit and a high band (2 GHz band) signal mainly passes through the bypass capacitor.

For example, in small mobile terminals such as smartphones, antenna impedances at the 800 MHz band and the 2 GHz band are usually lower than the impedance of RFIC antenna port. Thus, the impedance converter circuit described in Japanese Patent No. 4761009 is effective. However, for example, assume a case that a condition is applied so as to achieve matching at the high band (2 GHz band) without adding an impedance converter circuit. In such case, the matching may be achieved at the low band by adding an impedance converter circuit, but the matching may not be achieved at the high band.

FIG. 13A and FIG. 13B depict an example in which no impedance converter circuit is provided. Here, a matching state is achieved at the high band, but a mismatching state occurs at the low band. FIG. 13A is a frequency characteristic diagram of return loss RL and insertion loss IL when an antenna is viewed from a power feed port, and FIG. 13B is a diagram in which impedances are represented on a Smith chart when the antenna is viewed from the power feed port.

In FIG. 13A and FIG. 13B, frequencies at respective markers are as follows (the same applies to FIGS. 14A and 14B and FIGS. 16A and 16B):

m1, m7, m11: 700 MHz
m2, m8, m12: 960 MHz
m3, m9, m13: 1.71 GHz
m4, m10, m14: 2.7 GHz

The foregoing range of 700 MHz to 960 MHz is the low band, and the foregoing range of 1.71 GHz to 2.7 GHz is the high band.

On the other hand, FIG. 14A and FIG. 14B are diagrams depicting a state that is changed after inserting an impedance converter circuit between a power feed circuit and an antenna. FIG. 14A is a frequency characteristic diagram of return loss RL and insertion loss IL when an impedance converter circuit side is viewed from a power feed port, and FIG. 14B is a diagram in which impedances are represented on a Smith chart when the impedance converter circuit side is viewed from the power feed port.

As depicted in FIG. 14B, impedance matching may be obtained at the low band represented with m1-m2 because of an effect of the impedance converter circuit. In the high band represented with m3-m4, however, as depicted with a circling dashed-dotted line, a circle is reduced in size and shifted to a higher impedance side.

As described above, an impedance-converting transformer circuit converts the impedance over a wide band range. Thus, it is difficult to make the transformer effective only at a specific frequency band. Accordingly, shifting of the matching by the impedance converter circuit becomes an issue.

On the other hand, in the impedance converter circuit described in International Publication No. WO 2012/153691, using the capacitor for bypassing becomes difficult in a case that an inductance component of the transformer circuit is small.

FIG. 15 depicts an example in which an impedance converter circuit including a transformer T1 and a bypass capacitor Cp is inserted between a power feed circuit 11 and an antenna element 12. FIG. 16A is a frequency characteristic diagram of return loss RL and insertion loss IL when an impedance converter circuit side is viewed from the power feed circuit 11, and FIG. 16B is a diagram in which impedances are represented on a Smith chart when the impedance converter circuit side is viewed from the power feed circuit 11. The frequencies of respective markers are the same as those in the above. Here, the capacitance of the bypass capacitor Cp is 15 pF. To reduce the insertion loss of the transformer T1, a reduction of the inductance of a primary coil L1 at the transformer T1 is effective. However, this also reduces the inductance of a secondary coil L2. Consequently, a high band signal is shunted at the secondary coil L2, thereby reducing the passing amount through the bypass capacitor Cp. For example, in a case that the inductance of the secondary coil L2 is equal to 5 nH or less, matching is not achieved at the high band as depicted in FIG. 16A and FIG. 16B.

SUMMARY OF THE INVENTION

Accordingly, preferred embodiments of the present invention provide an impedance converter circuit that achieves impedance matching over a wide band range while being compatible with downsizing, and provide a communication terminal device including such an impedance converter circuit.

An impedance converter circuit according to a preferred embodiment of the present invention is preferably for use in an antenna device that transmits and receives a high frequency signal in a frequency band range including a first frequency band and a second frequency band whose frequency band range is higher than the first frequency band, and includes a transformer including a primary coil and a secondary coil, the primary coil being connected to a power feed port; a phase shifter circuit connected between the secondary coil of the transformer and an antenna port; and a bypass circuit connected between the power feed port and the antenna port, wherein, in the second frequency band, an absolute value of impedance of the transformer viewed from the antenna port via the phase shifter circuit is higher than an absolute value of impedance of the bypass circuit, and, in the first frequency band, the absolute value of the impedance of the transformer viewed from the antenna port via the phase shifter circuit is lower than the absolute value of the impedance of the bypass circuit.

A communication terminal device according to another preferred embodiment of the present invention includes an antenna device that transmits and receives a high frequency signal in a frequency band range including a first frequency band and a second frequency band whose frequency band range is higher than the first frequency band and an impedance converter circuit connected between the antenna device and a power feed circuit, wherein the impedance converter circuit includes a transformer including a primary coil and a secondary coil, the primary coil being connected to a power feed port; a phase shifter circuit connected between the secondary coil of the transformer and an antenna port; and a bypass circuit connected between the power feed port and the antenna port, and wherein, in the second frequency band, an absolute value of impedance of the transformer viewed from the antenna port via the phase shifter circuit is higher than an absolute value of impedance of the bypass circuit, and, in the first frequency band, the absolute value of the impedance of the transformer viewed from the antenna port via the phase shifter circuit is lower than the absolute value of the impedance of the bypass circuit.

According to impedance converter circuits according to preferred embodiments of the present invention, impedance matching between an antenna element and a high frequency circuit over a wide band range is able to be designed with relative ease and installed with a simpler configuration.

Furthermore, communication terminal devices according to preferred embodiments of the present invention are easily applied to various types of communication systems that use different frequency band ranges.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 13A is a frequency characteristic diagram of return loss RL and insertion loss IL when an impedance converter circuit 101 is viewed from a power feed port P1, and FIG. 13B is a diagram in which impedances are represented on a Smith chart when the impedance converter circuit 101 is viewed from the power feed port P1.

DETAILED DESCRIPTION OF THE PREFERRED EMBODIMENTS

Figure 1A:
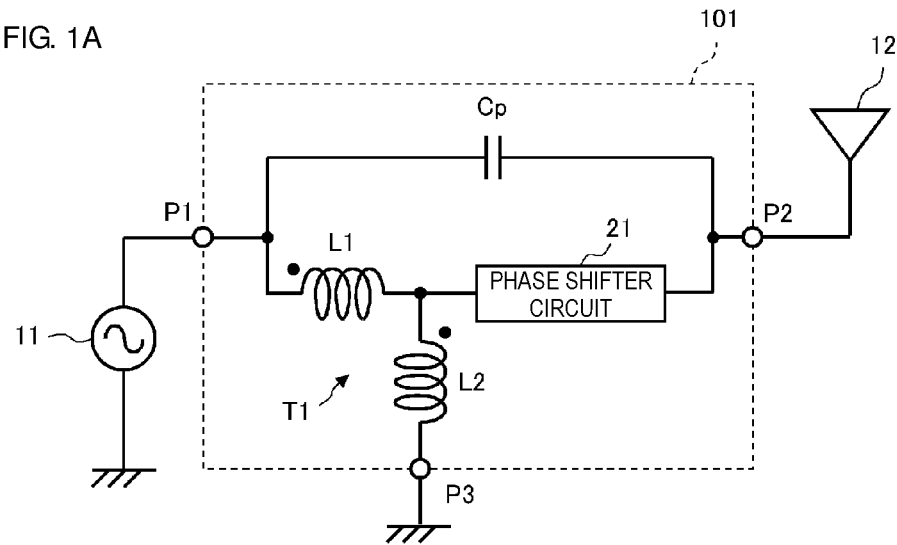
FIG. 1A is a circuit diagram of an impedance converter circuit 101 according to a first preferred embodiment and an antenna device including the impedance converter circuit 101.

A plurality of preferred embodiments of the present invention are described hereinafter with some specific examples while referring to the drawings. The same reference characters designate the same elements throughout the several views. Each preferred embodiment is for illustrative purposes only, and configurations of different preferred embodiments may be partially combined or exchanged.

First Preferred Embodiment

Figure 1B:
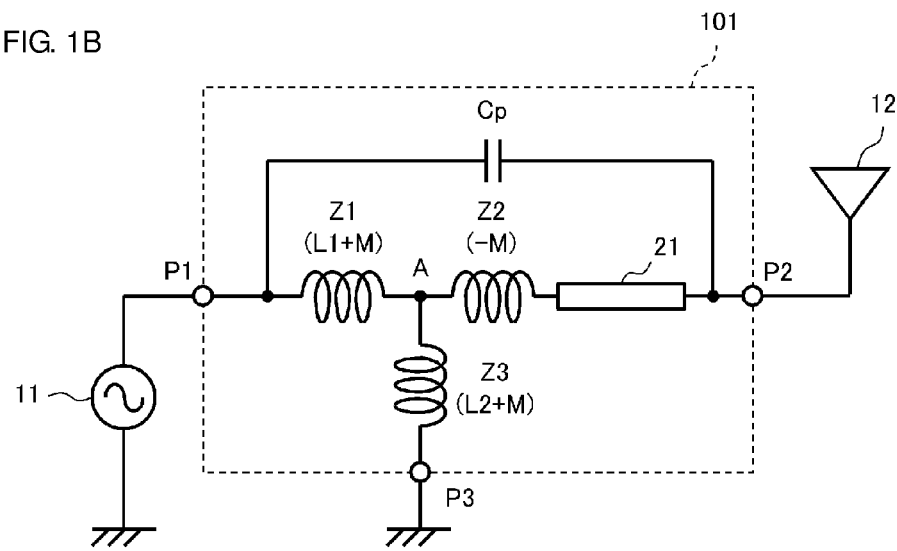
FIG. 1B is an equivalent circuit diagram of the impedance converter circuit 101.

FIG. 1A is a circuit diagram of an impedance converter circuit 101 according to the first preferred embodiment and an antenna device including the impedance converter circuit 101. FIG. 1B is an equivalent circuit diagram thereof. As depicted in FIG. 1A, the antenna device includes an antenna element 12 and the impedance converter circuit 101 connected to the antenna element 12. The impedance converter circuit 101 is located between the antenna element 12 and a power feed circuit (high frequency circuit) 11. In other words, an antenna port P2 of the impedance converter circuit 101 is connected to the antenna element 12, a power feed port P1 is connected to the power feed circuit 11, and a ground port P3 is grounded.

The antenna element 12 is a broadband antenna that is able to be used in both the low band and the high band. The antenna element 12 is, for example, a T-branched type antenna. The power feed circuit 11 is a high frequency circuit such as RFIC and the like, and supplies a high frequency signal to the antenna element 12. The power feed circuit 11 may include a circuit that multiplexes or demultiplexes a high frequency signal.

The impedance converter circuit 101 includes a high frequency transformer T1 including a primary coil L1 and a secondary coil L2, a phase shifter circuit 21, and a bypass capacitor Cp defining and functioning as a bypass circuit. The primary coil L1 and the secondary coil L2 of the transformer T1 are magnetically coupled. The primary coil L1 is connected between the power feed port P1 and the phase shifter circuit 21. In other words, a first end portion of the primary coil L1 is connected to the power feed port P1, and a second end portion of the primary coil L1 is connected to the phase shifter circuit 21. The secondary coil L2 is connected between the phase shifter circuit 21 and the ground port P3. In other words, a first end portion of the secondary coil L2 is connected to the phase shifter circuit 21, and a second end portion of the secondary coil L2 is connected to ground. Furthermore, the bypass capacitor Cp is connected between the power feed port P1 and the antenna port P2. The phase shifter circuit 21 is, for example, a transmission line having a predetermined electrical length.

The transformer T1 is an auto transformer circuit, and is able to be equivalently converted to a T-shape circuit including a first inductance element Z1 having inductance (L1+M), a second inductance element Z2 having inductance (−M), and a third inductance element Z3 having inductance (L2+M), as depicted in FIG. 1B. In other words, this T-shape circuit includes the first inductance element Z1 connected between the power feed port P1 and a branching point A, the second inductance element Z2 connected between the antenna port P2 and the branching point A, and the third inductance element Z3 connected between the ground port P3 and the branching point A.

In the example depicted in FIG. 1A and FIG. 1B, the impedance conversion ratio of the transformer T1 is {(L1+M)+(L2+M)}:{(−M)+(L2+M)}=(L1+L2+2M):L2.

As described above, the impedance conversion ratio may be made larger by using the auto transformer circuit despite of the small size thereof. Thus, this is also applicable to an antenna element having very low impedance compared with that of the power feed circuit 11.

Figure 2:
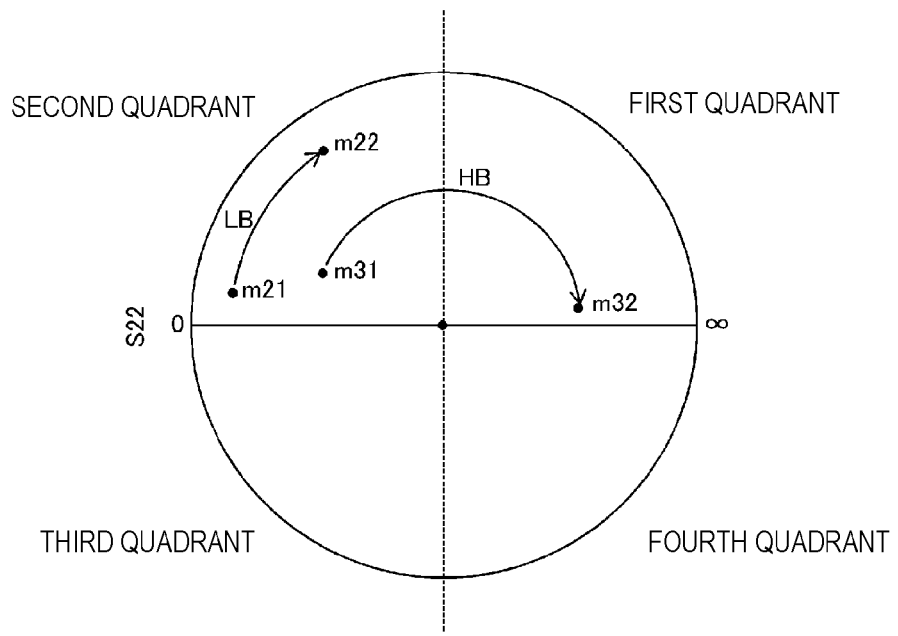
FIG. 2 is a diagram depicting how the impedances which are viewed from an antenna port P2 to a transformer T1 side in FIG. 1A change by a phase shifter circuit 21.

FIG. 2 is a diagram representing impedances, which are viewed from an antenna port P2 to a transformer T1 side in FIG. 1A, on a Smith chart, and depicting how these impedances change with the phase shifter circuit 21. In FIG. 2, a marker m21 is the impedance at a center frequency of the low band LB (for example, 800 MHz band) in a case that the phase shifter circuit 21 is absent, and a marker m22 is the impedance at the center frequency of the low band LB in a case that the phase shifter circuit 21 is inserted. Furthermore, a marker m31 is the impedance at a center frequency of the high band HB (for example, 2 GHz band) in a case that the phase shifter circuit 21 is absent, and a marker m32 is the impedance at the center frequency of the high band HB in a case that the phase shifter circuit 21 is inserted.

Here, a 50 Ω system transmission line is described as a non-limiting example. However, the characteristic impedance of the transmission line may be modified as needed depending on designing.

The amount of phase shift by the phase shifter circuit 21 is proportional or approximately proportional to the frequency. Thus, the phase of a signal in the high band rotates nearly twice as much as the phase of a signal in the low band. As a result, as depicted in FIG. 2, in the high band, the impedance becomes a high impedance when the transformer T1 is viewed from the antenna port P2 via the phase shifter circuit 21.

Figure 3A:
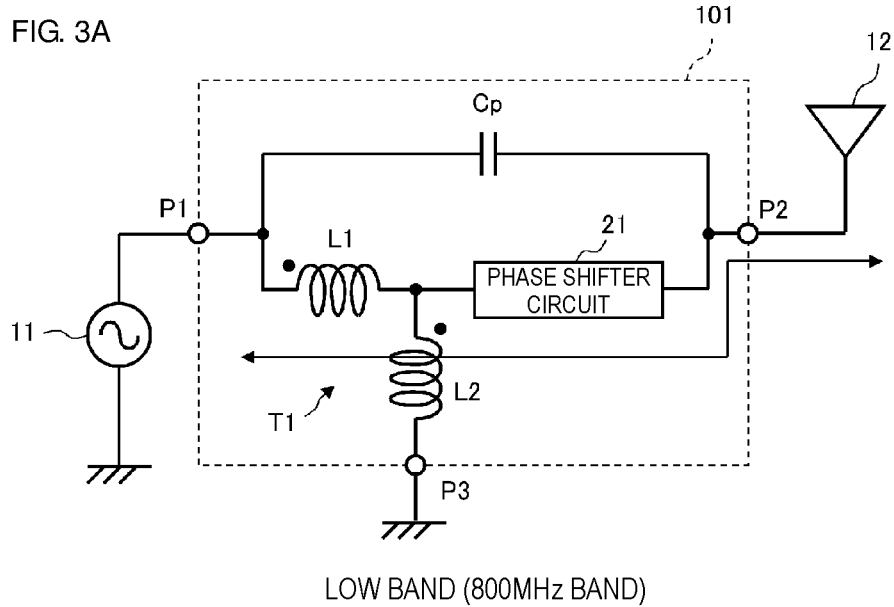
FIG. 3A and FIG. 3B are diagrams depicting paths of signals that pass through the impedance converter circuit 101.
Figure 3B:
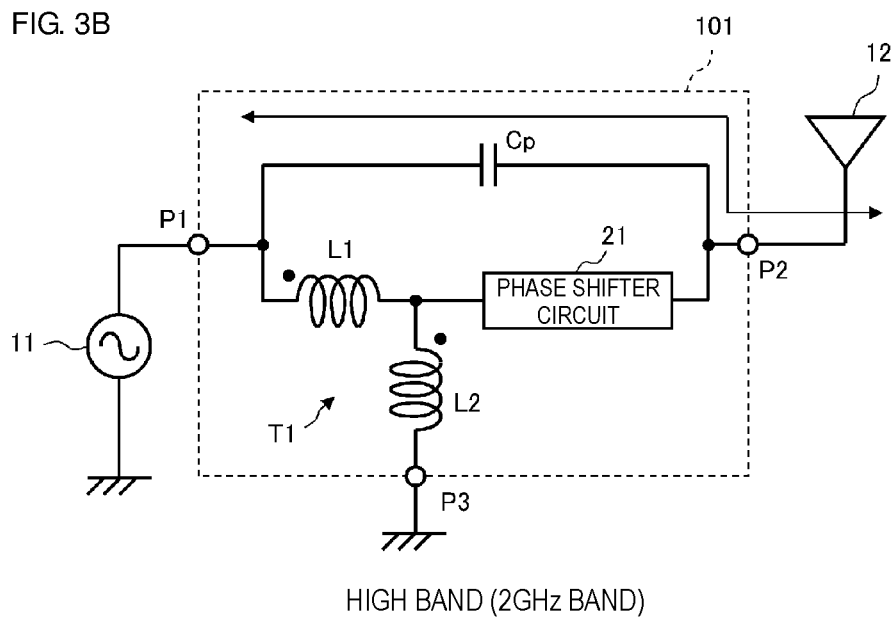

FIG. 3A and FIG. 3B are diagrams depicting paths of signals that pass through the impedance converter circuit 101. FIG. 3A is a signal path of the low band (for example, 800 MHz band), and FIG. 3B is a signal path of the high band (for example, 2 GHz band). The amount of phase shift of the phase shifter circuit 21 is determined in such a way that, in the high band, the absolute value of the impedance of the transformer T1 viewed from the antenna port P2 via the phase shifter circuit 21 becomes a maximum as depicted in FIG. 2 (that is, a phase shifter causes the impedances at the low band side to stay within a second quarter or a third quarter while causing the impedances at the high band side to locate within a first quarter or a fourth quarter). Here, in a polar coordinate of the Smith chart, a region in which the real part of the reflection coefficient (complex reflection coefficient p) is positive and the imaginary part thereof is positive is represented as the first quarter, a region in which the real part of the reflection coefficient is negative and the imaginary part thereof is positive is represented as the second quarter, a region in which the real part of the reflection coefficient is negative and the imaginary part thereof is negative is represented as the third quarter, and a region in which the real part of the reflection coefficient is positive and the imaginary part thereof is negative is represented as the fourth quarter. Furthermore, the capacitance of the bypass capacitor Cp is determined in such a way that, in the high band, the absolute value of the impedance of the bypass capacitor Cp becomes lower than the absolute value of the impedance of the transformer T1 viewed from the antenna port P2 via the phase shifter circuit 21. This allows a signal in the high band passing through a path that passes through the bypass capacitor Cp as depicted in FIG. 3B. In the low band, the absolute value of the impedance of the bypass capacitor Cp becomes large (becomes a maximum in a utilized frequency range (sufficiently large)), and the absolute value of the impedance of the transformer T1 viewed from the antenna port P2 via the phase shifter circuit 21 is lower than the absolute value of the impedance of the bypass capacitor Cp. Thus, a signal in the low band passes through a path that passes through the phase shifter circuit 21 and the transformer T1 as depicted in FIG. 3A.

The impedance converter circuit 101 includes the path passing through the transformer T1 depicted in FIG. 3A and the path passing through the bypass capacitor Cp depicted in FIG. 3B, and these two paths define a closed loop. Since the paths are different in the low band and the high band, resonance occurs at the closed loop at a frequency between the low band and the high band, causing a pole to be unable to pass. In other words, as depicted in FIG. 3A and FIG. 3B, the signal path is able to be switched at the low band and the high band by setting a self-resonant frequency of the impedance converter circuit, exactly a transformer circuit, between the low band and the high band.

Figure 4A:
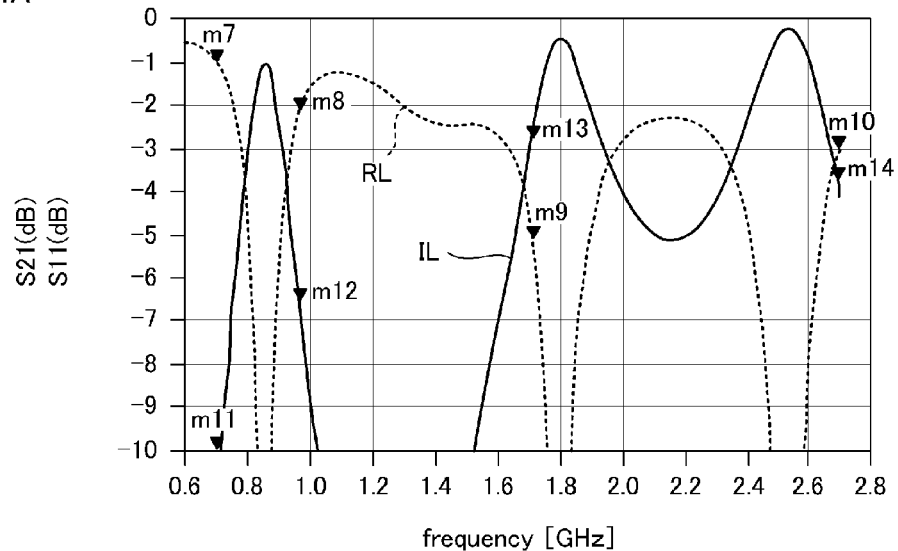
FIG. 4A is a frequency characteristic diagram of return loss RL and insertion loss IL when the impedance converter circuit 101 is viewed from a power feed port P1 in an antenna device according to the present preferred embodiment.
Figure 4B:
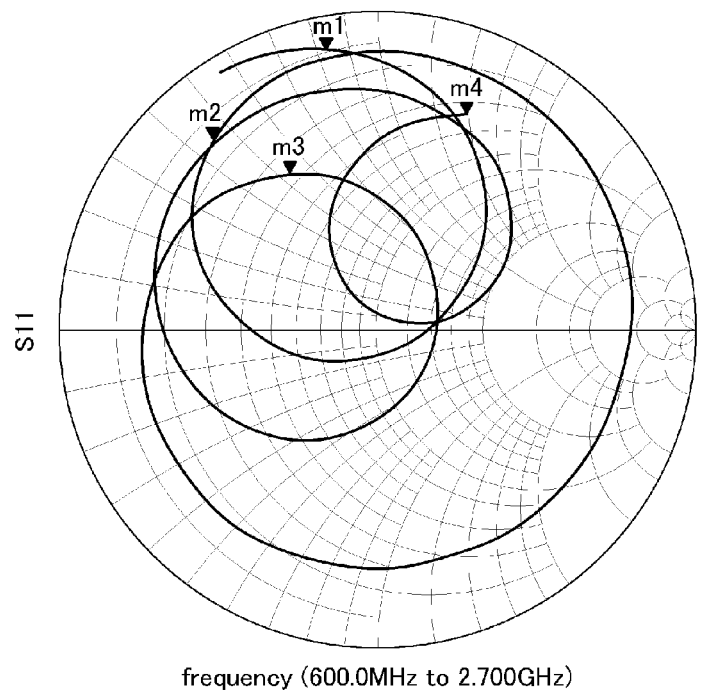
FIG. 4B is a diagram in which impedances are represented on a Smith chart when the impedance converter circuit 101 is viewed from the power feed port P1.

FIG. 4A is a frequency characteristic diagram of return loss RL and insertion loss IL when the impedance converter circuit 101 is viewed from the power feed port P1 in the antenna device according to the present preferred embodiment. FIG. 4B is a diagram in which impedances are represented on a Smith chart when the impedance converter circuit 101 is viewed from the power feed port P1.

In FIG. 4A and FIG. 4B, the frequencies of respective markers are the same as those of the examples depicted in FIGS. 13A and 13B and FIGS. 14A and 14B, and are as follows:

m1, m7, m11: 700 MHz
m2, m8, m12: 960 MHz
m3, m9, m13: 1.71 GHz
m4, m10, m14: 2.7 GHz

The foregoing range of 700 MHz to 960 MHz is the low band, and the foregoing range of 1.71 GHz to 2.7 GHz is the high band, for example.

In the antenna element 12, a quarter-wavelength resonance occurs at about 800 MHz, and its harmonic resonances occur at about 1.8 GHz and about 2.5 GHz, for example. In other words, the antenna element 12 defines and functions as an antenna for the low band with this quarter-wavelength resonance and as an antenna for the high band with the harmonic resonances thereof. Three decreases in the return loss depicted in FIG. 4A are caused by the foregoing three resonances at the antenna element 12.

Figure 13A:
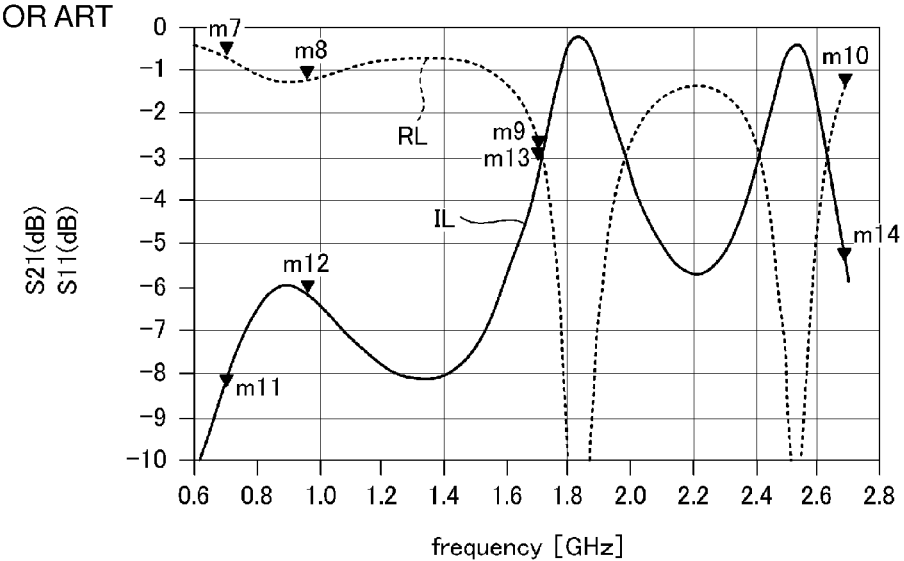
FIG. 13A and FIG. 13B are characteristic diagrams in a case that an impedance converter circuit without a phase shifter circuit 21 is inserted.
Figure 13B:
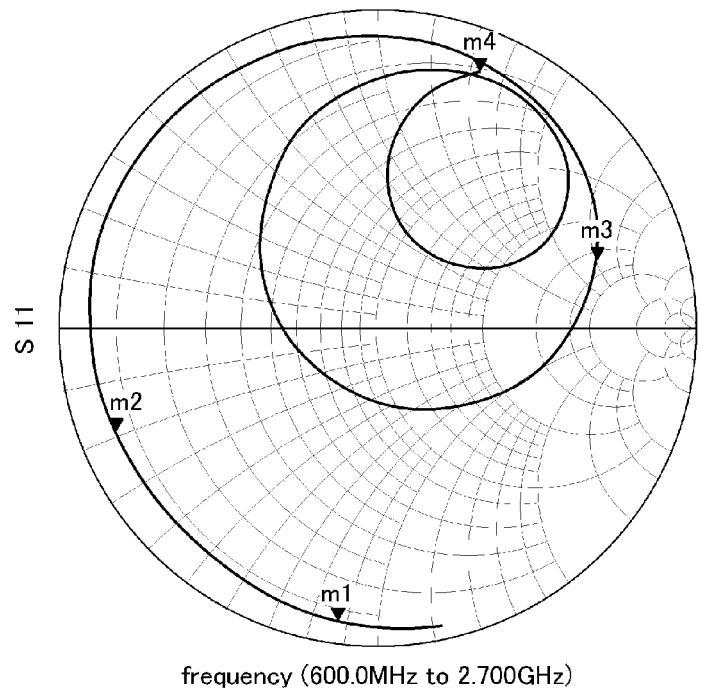
Figure 14A:
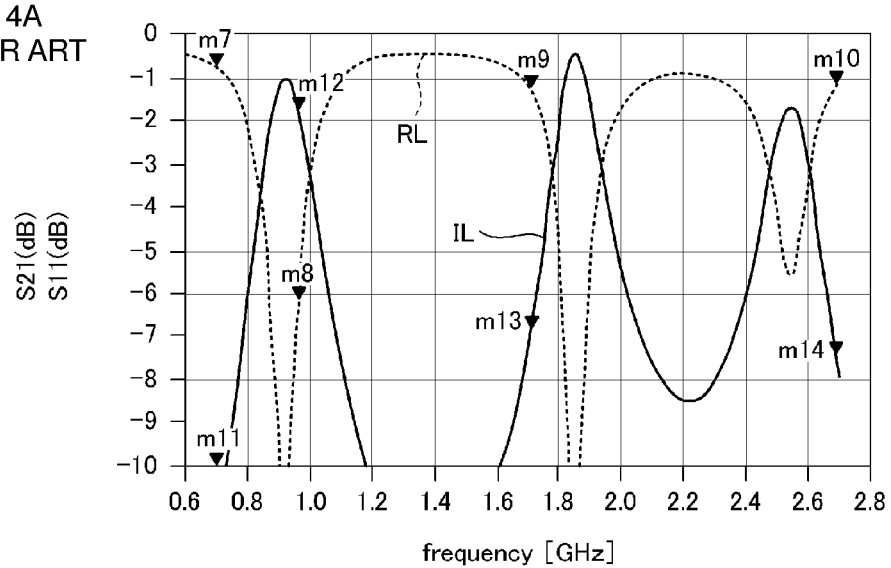
FIG. 14A and FIG. 14B are characteristic diagrams in a case that an impedance converter circuit configured using a prior art transformer is inserted between a power feed circuit and an antenna.
Figure 14B:
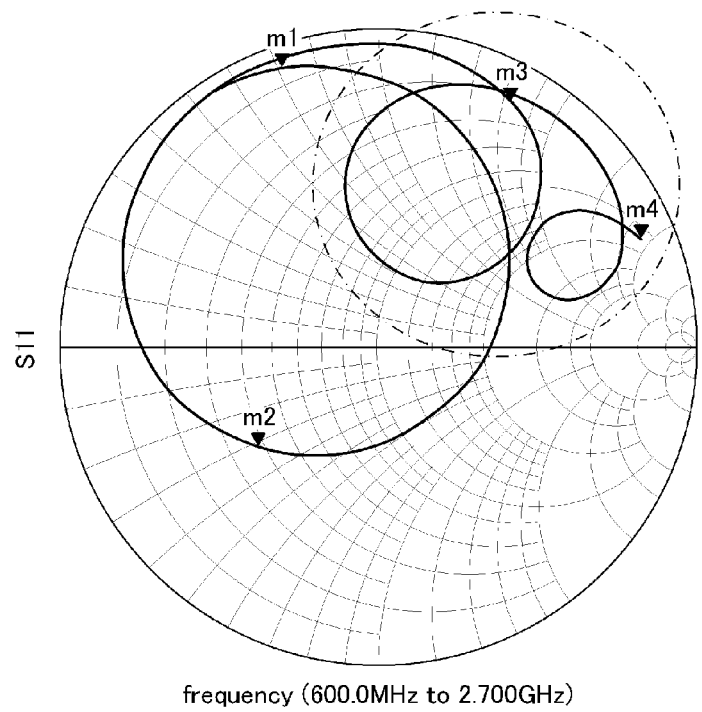
Figure 15:
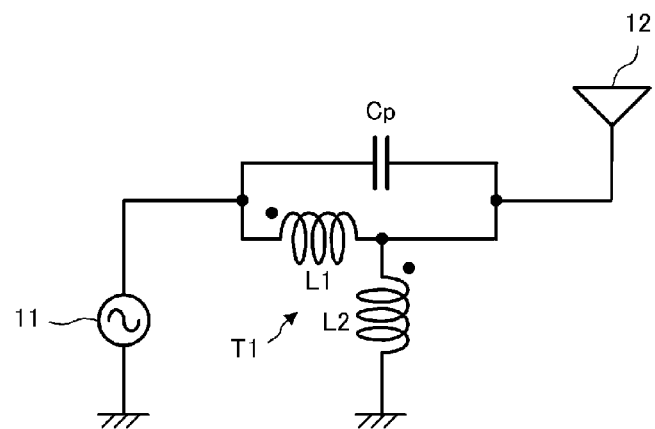
FIG. 15 is a diagram depicting an example in which a prior art impedance converter circuit including the transformer T1 and a bypass capacitor Cp is inserted between a power feed circuit 11 and an antenna element 12.
Figure 16A:
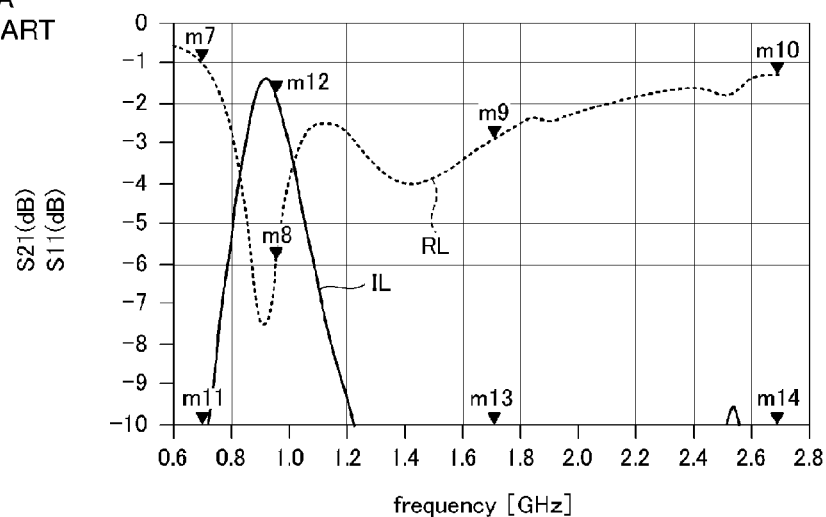
FIG. 16A is a frequency characteristic diagram of return loss RL and insertion loss IL when an impedance converter circuit side is viewed from the power feed circuit 11 in the circuit depicted in FIG. 15.
Figure 16B:
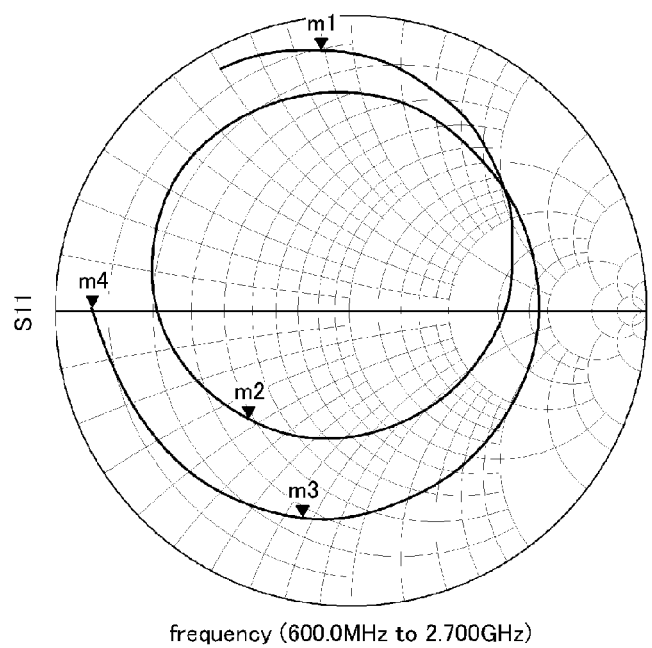
FIG. 16B is a diagram in which impedances are represented on a Smith chart when the impedance converter circuit side is viewed from the power feed circuit 11.

FIG. 13A and FIG. 13B depict the characteristics in the case that the impedance converter circuit without the phase shifter circuit 21 is inserted. Compared with FIG. 13A and FIG. 13B, it is clear that the antenna device according to the present preferred embodiment achieves matching at the low band and that matching at the high band is not shifted. As is clear from a change from FIG. 13B to FIG. 4B, circles (two circle rotations) of the impedance trajectory at the high band (m3-m4) are not reduced.

Figure 5:
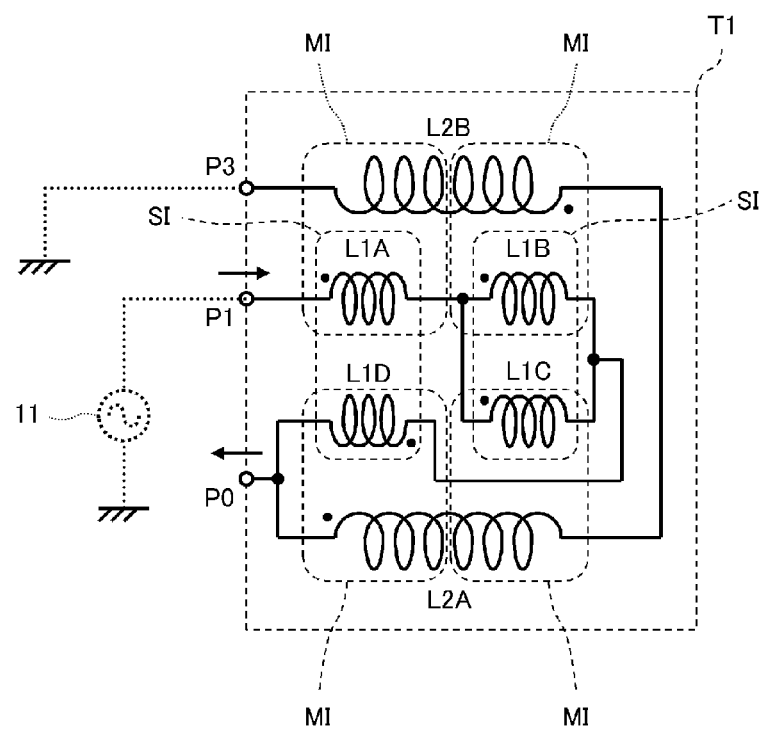
FIG. 5 is a circuit diagram of a transformer T1 that is included in the impedance converter circuit 101 according to the first preferred embodiment of the present invention.
Figure 6:
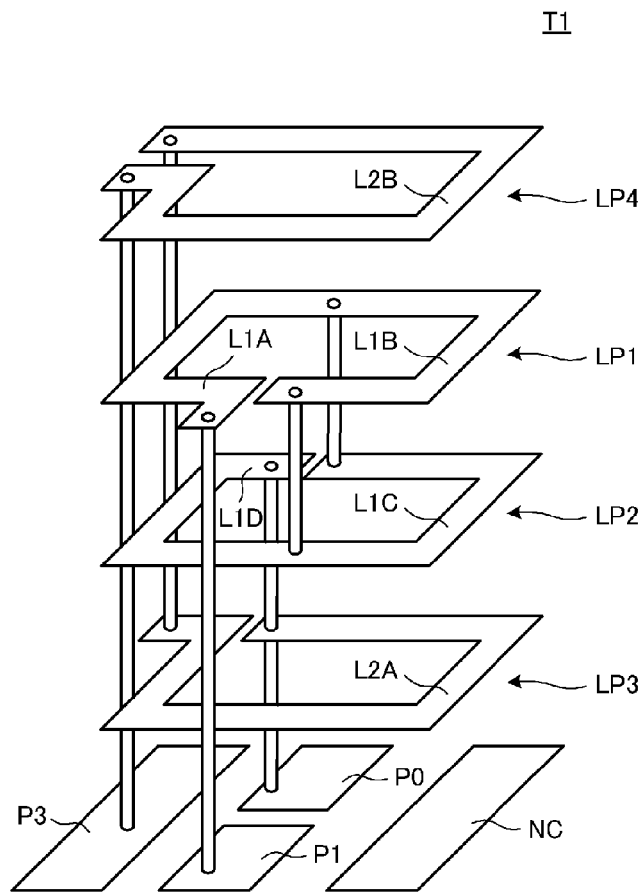
FIG. 6 is a perspective view of various conductor patterns of the impedance converter circuit 101.

FIG. 5 is a circuit diagram of the transformer T1 that is included in the impedance converter circuit 101 according to the first preferred embodiment. Here, the arrangement relationship between primary coils and secondary coils in a multilayer base body is taken into consideration. FIG. 6 is a perspective view of various conductor patterns of the transformer T1. In FIG. 6, dielectric base layers on which these conductor patterns are provided are excluded. In other words, the auto transformer preferably is a surface mount component that is able to be mounted on a printed wiring board.

As depicted in FIG. 6, a first loop conductor LP1 including conductor patterns L1A and L1B, a second loop conductor LP2 including conductor patterns L1C and L1D, a third loop conductor LP3 including a conductor pattern L2A, and a fourth loop conductor LP4 including a conductor pattern L2B are each provided. The conductor patterns at respective layers are connected across different layers with via conductors.

On a bottom plane of a lowest layer of the base layers, terminals corresponding to a first port (power feed port) P1, a second port (antenna side port) P0, and a third port (ground port) P3, and another terminal for mounting (empty terminal NC) are provided. These terminals are provided at the bottom plane of a lowest layer of the base layers.

The primary coil (L1 depicted in FIG. 1A) includes the first loop conductor LP1 and the second loop conductor LP2. The secondary coil (L2 depicted in FIG. 1A) includes the third loop conductor LP3 and the fourth loop conductor LP4.

The first loop conductor LP1 and the second loop conductor LP2 are interposed between the third loop conductor LP3 and the fourth loop conductor LP4 in a layer direction.

The conductor pattern L1B, which is included in the first loop conductor LP1, and the conductor pattern L1C, which is included in the second loop conductor LP2, are connected in parallel. Furthermore, the conductor pattern L1A, which is included in the first loop conductor LP1, and the conductor pattern L1D, which is included in the second loop conductor LP2, are connected in series with respect to the foregoing parallel circuit.

The third loop conductor LP3 including the conductor pattern L2A and the fourth loop conductor LP4 including the conductor pattern L2B are connected in series.

As depicted in FIG. 5, the primary coil achieves a large inductance value because of strong magnetic coupling between the conductor patterns L1A and L1D (self-induction SI) and strong magnetic coupling between the conductor patterns L1B and L1C (self-induction SI). This increases the inductance per unit coil length and improves the Q value of the primary coil, thereby reducing the loss.

Furthermore, the coupling factor between the primary coil and the secondary coil increases because of the magnetic coupling between the conductor patterns L1A, L1B and the conductor pattern L2B (mutual induction MI) and the magnetic coupling between the conductor patterns L1C, L1D and the conductor pattern L2A (mutual induction MI).

The phase circuit may include a high frequency transmission line provided on a printed wiring board, such as a stripline, a micro stripline, a coplanar line, and the like.

Second Preferred Embodiment

In the second preferred embodiment of the present invention, several configurations of the impedance converter circuit different from that of the impedance converter circuit 101 described in the first preferred embodiment are described with reference to FIG. 7 to FIG. 11.

Figure 7:
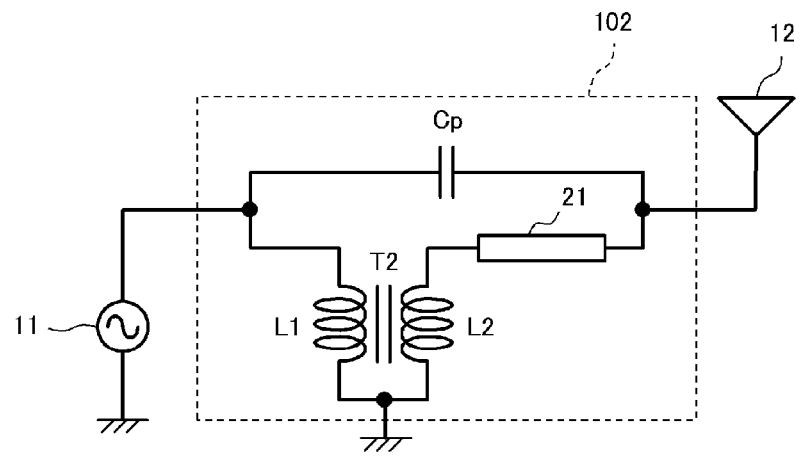
FIG. 7 is a circuit diagram of an impedance converter circuit 102 including a typical transformer in which a primary coil and a secondary coil are independent from each other.

FIG. 7 is a circuit diagram of an impedance converter circuit 102 including a typical transformer in which a primary coil and a secondary coil are independent from each other. A transformer T2 converts impedance in accordance with the turns ratio of a primary coil L1 and a secondary coil L2.

Figure 8:
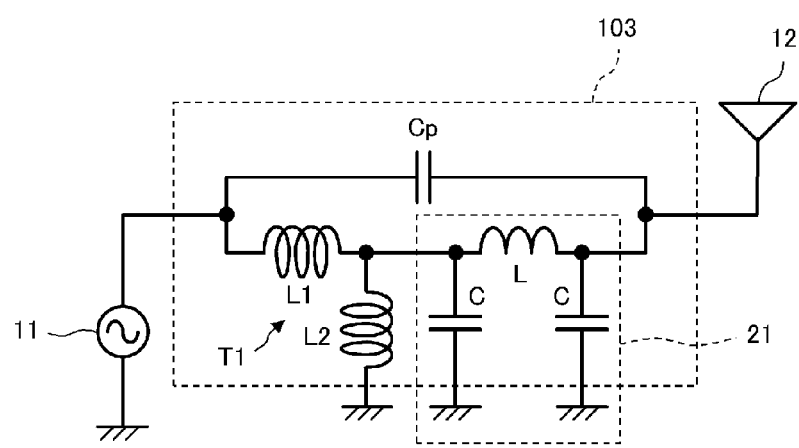
FIG. 8 is a circuit diagram of an impedance converter circuit 103, which depicts a configuration example of the phase shifter circuit 21.

FIG. 8 is a diagram depicting a configuration example of a phase shifter circuit 21. This phase shifter circuit 21 includes an inductor L connected in series to a line and capacitors C connected to the line so as to define shunts therebetween. Compared with a case that the phase shifter circuit includes a transmission line having a preset electrical length, the phase shifter circuit may be made smaller although the applicable frequency range is narrower.

Figure 9:
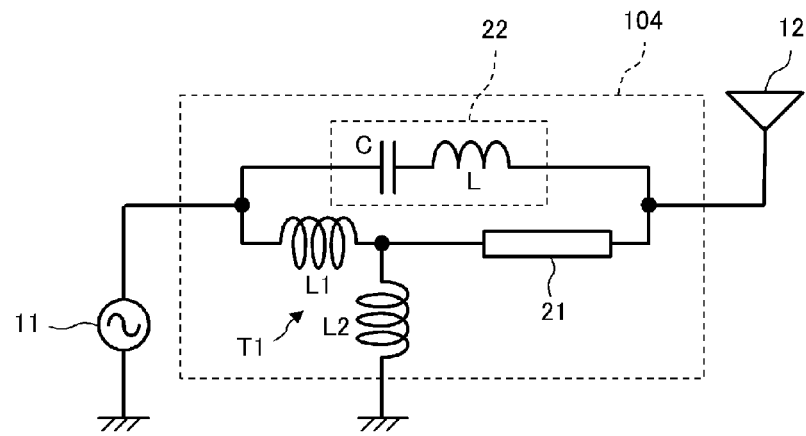
FIG. 9 is a circuit diagram of an impedance converter circuit 104, which depicts a configuration example of a bypass circuit 22.

FIG. 9 is a diagram depicting a configuration example of a bypass circuit 22. The bypass circuit 22 includes a LC series resonance circuit. A resonant frequency of the bypass circuit 22 is equal to a frequency (for example, 1.7 GHz) within the frequency band of the high band or a frequency close to that frequency band. This causes a relatively narrow band signal including the resonant frequency of the bypass circuit 22 to bypass while enabling the transformer T1 to convert impedance at a frequency band other than the above.

Figure 10:
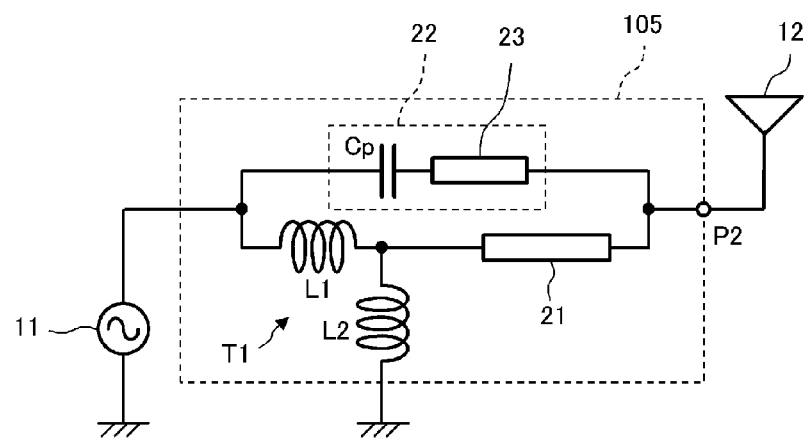
FIG. 10 is a circuit diagram of an impedance converter circuit 105, which depicts another configuration example of the bypass circuit 22.

FIG. 10 is a diagram depicting another configuration example of the bypass circuit 22. This bypass circuit 22 includes a series circuit including a bypass capacitor Cp and a phase shifter circuit 23. Even in such a configuration, the bypass circuit 22 is able to set the imaginary component of impedance to 0 at a preset frequency and allows a signal at a frequency band including that preset frequency to bypass. Furthermore, compared with the case that the configuration includes the LC series resonance circuit depicted in FIG. 9, the bypassing frequency band may be made wider.

Figure 11:
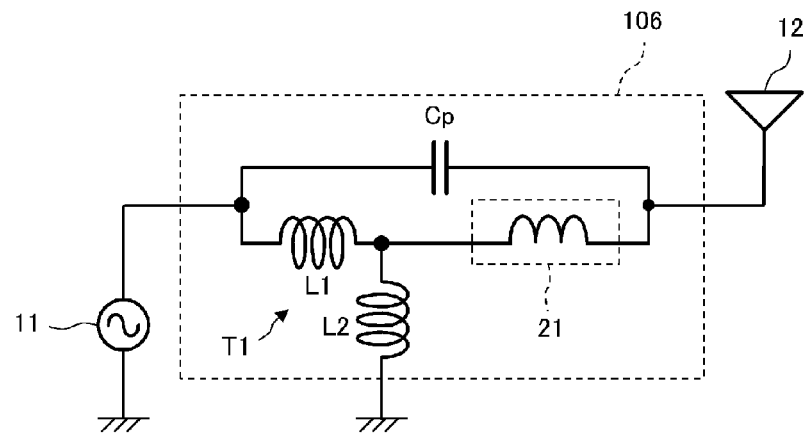
FIG. 11 is a circuit diagram of an impedance converter circuit 106, which depicts a configuration example of the phase shifter circuit 21.

FIG. 11 is a diagram depicting a configuration example of the phase shifter circuit 21. This phase shifter circuit 21 includes an inductor connected in series to a line. In such a case that the phase shifter circuit includes the inductor, the inductance of the phase shifter circuit 21 may be determined in such a way that the impedance becomes high impedance at the high band when the transformer T1 is viewed from the antenna port P2 via the phase shifter circuit 21.

In any one of the configurations depicted in FIG. 7 to FIG. 11, the path is able to be switched at the low band and the high band by setting the resonant frequency of the impedance converter circuit between the low band and the high band, as is the case depicted in FIG. 3A and FIG. 3B.

Third Preferred Embodiment

Figure 12:
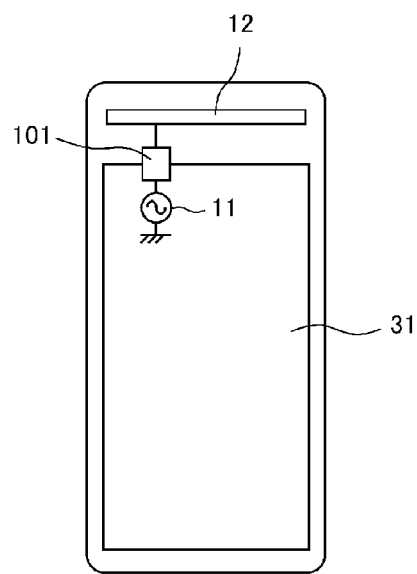
FIG. 12 is a diagram depicting a configuration of communication terminal device such as a cellular phone terminal and the like according to a third preferred embodiment of the present invention.

FIG. 12 is a diagram depicting a configuration of communication terminal device such as a cellular phone terminal and the like according to the third preferred embodiment of the present invention. The FIG. 12 depicts major components inside a casing of the communication terminal device. Inside the casing, an antenna element 12 and a circuit board are provided, and the circuit board is provided with a ground conductor 31, an impedance converter circuit 101, and a power feed circuit 11. The antenna element 12 preferably is a T-branched type antenna. The ground conductor 31 defines and functions as a conductor to form an image of the antenna element 12 or as a radiation element together with the antenna element 12.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An impedance converter circuit for use in an antenna device that transmits and receives a high frequency signal in a frequency band range including a first frequency band and a second frequency band whose frequency band range is higher than the first frequency band, the impedance converter circuit comprising:
   a transformer including a primary coil and a secondary coil, the primary coil being connected to a power feed port;
   a phase shifter circuit connected between the secondary coil of the transformer and an antenna port; and
   a bypass circuit connected between the power feed port and the antenna port; wherein
   in the second frequency band, an absolute value of impedance of the transformer viewed from the antenna port via the phase shifter circuit is higher than an absolute value of impedance of the bypass circuit; and
   in the first frequency band, the absolute value of the impedance of the transformer viewed from the antenna port via the phase shifter circuit is lower than the absolute value of the impedance of the bypass circuit.

2. The impedance converter circuit according to claim 1, wherein a self-resonant frequency of the impedance converter circuit is between the first frequency band and the second frequency band.

3. The impedance converter circuit according to claim 1, wherein the phase shifter circuit includes a transmission line.

4. The impedance converter circuit according to claim 1, wherein the phase shifter circuit includes an inductor connected in series to a line and a capacitor connected to the line so as to define a shunt therebetween.

5. The impedance converter circuit according to claim 1, wherein
   a first end portion of the primary coil is connected to the power feed port;
   a second end portion of the primary coil is connected to ground;
   a first end portion of the secondary coil is connected to the antenna port;
   a second end portion of the secondary coil is connected to ground; and
   the bypass circuit is connected between the first end portion of the primary coil and the first end portion of the secondary coil.

6. The impedance converter circuit according to claim 1, wherein
   a first end portion of the primary coil is connected to the power feed port;
   a second end portion of the primary coil is connected to the antenna port;
   a first end portion of the secondary coil is connected to ground;
   a second end portion of the secondary coil is connected to the antenna port; and
   the bypass circuit is connected between the first end portion of the primary coil and the second end portion of the secondary coil.

7. The impedance converter circuit according to claim 1, wherein the transformer is one of an auto transformer circuit and a transformer that is capable of being converted to a T-shape circuit including a first inductance element with a first inductance, a second inductance element with a second inductance, and a third inductance element with a third inductance.

8. The impedance converter circuit according to claim 1, wherein the primary coil and the secondary coil of the transformer are independent of one another.

9. The impedance converter circuit according to claim 1, wherein the bypass circuit includes an LC series resonant circuit.

10. The impedance converter circuit according to claim 1, wherein the bypass circuit includes a series circuit including a bypass capacitor and the phase shifter circuit.

11. The impedance converter circuit according to claim 1, wherein the bypass circuit includes an inductor and a line connected in series.

12. An antenna device that transmits and receives a high frequency signal in a frequency band range including a first frequency band and a second frequency band whose frequency band range is higher than the first frequency band, the antenna device comprising:
   an antenna element; and
   an impedance converter circuit connected to the antenna element; wherein
   the impedance converter circuit includes:
      a transformer including a primary coil and a secondary coil, the primary coil being connected to a power feed port;
      a phase shifter circuit connected between the secondary coil of the transformer and an antenna port; and
      a bypass circuit connected between the power feed port and the antenna port; wherein
      in the second frequency band, an absolute value of impedance of the transformer viewed from the antenna port via the phase shifter circuit is higher than an absolute value of impedance of the bypass circuit; and in the first frequency band, the absolute value of the impedance of the transformer viewed from the antenna port via the phase shifter circuit is lower than the absolute value of the impedance of the bypass circuit.

13. The antenna device according to claim 12, further comprising:

a power feed circuit; wherein the impedance converter circuit is located between the antenna element and the power feed circuit.

14. The antenna device according to claim 13, wherein the power-feed circuit is one of a high frequency circuit, an RFIC, and a circuit that multiplexes or demultiplexes a high frequency signal.

15. The antenna device according to claim 12, wherein the antenna element is one of a broadband antenna and a T-branched antenna.

16. The antenna device according to claim 12, wherein the transformer is one of an auto transformer circuit and a transformer that is capable of being converted to a T-shape circuit including a first inductance element with a first inductance, a second inductance element with a second inductance, and a third inductance element with a third inductance.

17. A communication terminal device including an antenna device that transmits and receives a high frequency signal in a frequency band range including a first frequency band and a second frequency band whose frequency band range is higher than the first frequency band and an impedance converter circuit connected between the antenna device and a power feed circuit, wherein the impedance converter circuit includes:

a transformer including a primary coil and a secondary coil, the primary coil being connected to a power feed port;

a phase shifter circuit connected between the secondary coil of the transformer and an antenna port; and a bypass circuit connected between the power feed port and the antenna port;

in the second frequency band, an absolute value of impedance of the transformer viewed from the antenna port via the phase shifter circuit is higher than an absolute value of impedance of the bypass circuit; and in the first frequency band, the absolute value of the impedance of the transformer viewed from the antenna port via the phase shifter circuit is lower than the absolute value of the impedance of the bypass circuit.

18. The communication terminal device according to claim 17, wherein a self-resonant frequency of the impedance converter circuit is between the first frequency band and the second frequency band.

19. The communication terminal device according to claim 17, wherein the phase shifter circuit includes a transmission line.

20. The communication terminal device according to claim 17, wherein the phase shifter circuit includes an inductor connected in series to a line and a capacitor connected to the line so as to define a shunt therebetween.

* * * * *